United States Patent [19]

Grammas et al.

[11] Patent Number: 5,086,371
[45] Date of Patent: Feb. 4, 1992

[54] PRINTED CIRCUIT BOARD ASSEMBLY HANDLE/STIFFENER

[75] Inventors: James J. Grammas, Westchester; James M. Maronn, Naperville; James R. Weston, Palos Park, all of Ill.

[73] Assignee: AG Communication Systems Corporation, Phoenix, Ariz.

[21] Appl. No.: 637,835

[22] Filed: Jan. 7, 1991

[51] Int. Cl.$^5$ .................. H05K 7/00; B23K 37/04
[52] U.S. Cl. ...................... 361/397; 361/399; 211/41; 269/903; 228/39; 228/47
[58] Field of Search ............. 361/395, 397, 399, 413, 361/415; 439/64, 476; 211/41; 269/903; 228/37, 39, 47, 57

[56] References Cited

U.S. PATENT DOCUMENTS 3,794,954 2/1974 Reimer ................. 361/413 X
4,694,380 9/1987 Mallory et al. ............. 361/415 X
4,755,907 7/1988 Belanger, Jr. .............. 361/413

Primary Examiner—Leo P. Picard
Assistant Examiner—Paramita Ghosh
Attorney, Agent, or Firm—Gregory G. Hendricks

[57] ABSTRACT

A printed circuit board handle is disclosed for use with a printed circuit board. The printed circuit board handle includes a flange that extends for the length of the handle and is mounted to the printed circuit board. Two ribs protrude from the side of the flange that is adjacent to the printed circuit board and extend for the length of the handle. The ribs contact the printed circuit board in such a manner as to separate the body of the flange from the printed circuit board and thereby prevent the capillary action that causes entrapment of flux between the flange and the printed circuit board, during the wave soldering process.

5 Claims, 3 Drawing Sheets

PRINTED CIRCUIT BOARD ASSEMBLY HANDLE/STIFFENER

FIELD OF THE INVENTION

The present invention relates to printed circuit boards and more particularly to a handle for such boards. The handle is arranged in such a manner as to inhibit entrapment of flux between the handle an the board during the wave soldering process.

BACKGROUND OF THE INVENTION

A printed circuit board handle is normally constructed as a simple aluminum extrusion and it generally serves several purposes. Its primary purpose is to provide a means for grasping the printed circuit board and thereby facilitate its insertion into and removal from electronic equipment. However, since printed circuit boards are typically wave soldered they can reach temperatures of 500 degrees Fahrenheit during that process. Therefore, another primary purpose of the printed circuit board handle is to provide a means of stiffening the printed circuit board in order to prevent it from warping in the high temperatures of the wave soldering process. Another subsidiary purpose of the printed circuit board handle is one of identification, since identifying markings, including bar code labels, are often placed on it.

Printed circuit boards are preheated before they are subjected to the high temperatures of the wave soldering process. Because of such preheating and the prevalent use of aggressive fluxes, the flux would often penetrate into and become entrapped in the area between the handle and the printed circuit board. After a few days time, moisture absorption by such entrapped flux would progress to the point of causing the entrapped flux to "bubble" out from between the handle and the printed circuit board. The flux bubbles must then be manually cleaned out using a brush and locally applied solvents. Even after cleaning, bubbles may reappear. The cleaning operation will then have to be repeated.

Alternatively, the printed circuit board can be baked prior to cleaning in order to accelerate the moisture absorption chemical reaction to completion and thereby preclude the need for repetitive cleaning due to prolonged bubbling. However, these baking, cleaning and retesting operations are expensive in terms of labor, inventory and scheduling disruption.

Other methods of cleaning, such as vapor degreasing, which comprises an aggressive spraying directed into the problem area, and spray over immersion, have also proven to be ineffective means of removal of entrapped flux.

Alternative mechanical approaches to remove entrapped flux included the use of dimples on the printed circuit board side of the handle's flange, but that approach was also unsuccessful. Another mechanical approach involved the use of Kapton tape over the crevice where flux excursion begins. While this method worked, its cost was prohibitive.

Accordingly, it is the object of the present invention to provide a novel printed circuit board handle which inhibits flux entrapment to such an extent that there is no need for baking, and only one conventional cleaning operation is required after the wave soldering process to remove entrapped flux.

SUMMARY OF THE INVENTION

A printed circuit board handle is provided for attachment to a printed circuit board. The printed circuit board handle comprises a flange having first and second ribs protruding therefrom. The ribs have substantially the same length and are positioned substantially parallel and in close proximity to, but spaced apart from, each other. The midpoint of each rib is located in a plane perpendicular to the longitudinal axes of said ribs. The flange is attachable to the printed circuit board in such a manner that the ribs cause the flange to be spaced apart from the printed circuit board.

DESCRIPTION OF THE PREFERRED EMBODIMENT

Figure 1:
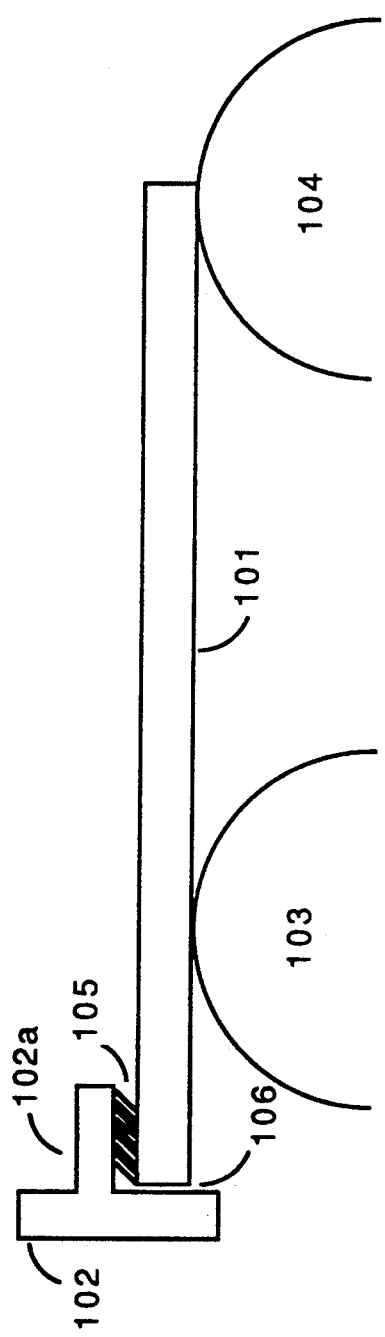
FIG. 1 of the accompanying drawing is an end view of a prior art printed circuit board and handle being subjected to a flux wave and then a solder wave.

Referring now to FIG. 1 a prior art printed circuit board is shown positioned above a wave of flux and a wave of solder. Printed circuit board 101 is shown adjacent to handle 102 and positioned above flux wave 103 and solder wave 104. Entrapped flux 105 is also shown between printed circuit board 101 and handle 102. The rivets used to connect handle 102 to printed circuit board 101 are not shown since they pass through handle flange 102a and printed circuit board 101 and are thus obscured by entrapped flux 105.

During the wave soldering process printed circuit board 101 is caused to move in such a direction that it first passes over flux wave 103 and then solder wave 104. When it passes over flux wave 103, flux excursion occurs as flux flows into vertical opening 106 between printed circuit board 101 and handle 102. The flux then flows by capillary action into the area between the top of printed circuit board 101 and the bottom of flange 102a resulting in entrapped flux 105. Moisture absorption subsequently occurs causing entrapped flux 105 to "bubble out" from between printed circuit board 101 and handle 102 even after repetitive cleaning operations. Such repetitive bubbling occurs because of the long term, continuous and incomplete nature of the moisture absorption process.

Figure 2:
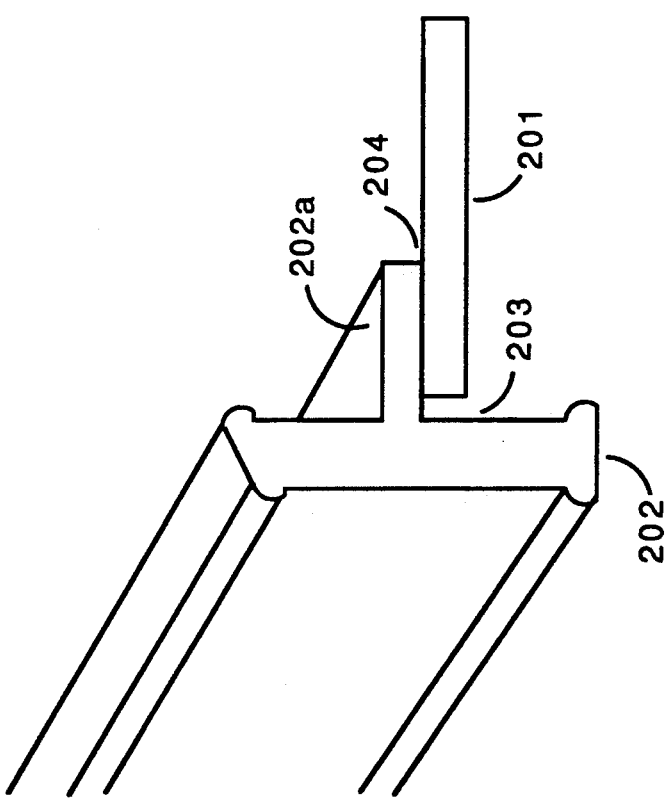
FIG. 2 of the accompanying drawing is an enlarged end view of a prior art printed circuit board and handle.

Referring now to FIG. 2 an enlarged view of a prior art printed circuit board and handle is shown. Printed circuit board 201 is shown positioned adjacent to handle 202 with the bottom of flange 202a positioned above the top of printed circuit board 201. Flux excursion again occurs in vertical opening 203 and entrapped flux 204 results from flux being drawn by capillary action along the top surface of printed circuit board 201 and the bottom surface of flange 202a. Such capillary action causes the entrapment of flux 204 even though flange 202a is riveted directly to printed circuit board 201 with no visible intervening gap. As was stated with reference to FIG. 1, entrapped flux 204 then "bubbles out" over time, due to moisture absorption. This results in the need for repetitive cleaning or other burdensome techniques such as baking to accelerate the moisture absorption process to completion. Since there would be no subsequent "bubbling" after the baking process, only one cleaning operation would be required if performed after the baking process.

Figure 3:
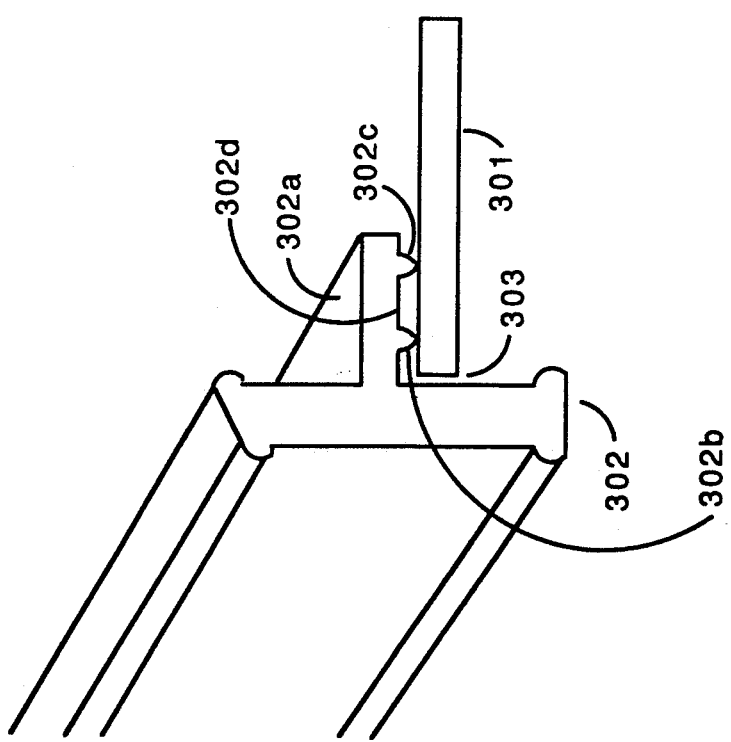
FIG. 3 of the accompanying drawing is an end view of a printed circuit board and the printed circuit board handle of the present invention.

Referring now to FIG. 3 a printed circuit board and the printed circuit board handle of the present invention are shown. Printed circuit board 301 is shown positioned adjacent to handle 302 with the bottom of flange 302a positioned above the top of printed circuit board 301. Flange 302a physically contacts printed circuit board 301 via ribs 302b and 302c, each of which extends across the full length of flange 302a. Ribs 302b and 302c protrude 0.020 inches below the bottom of flange 302a thereby creating a 0.020 inch gap between printed circuit board 301 and the body of flange 302a.

Flux excursion still occurs in vertical opening 303 but the flux is not entrapped in the space between ribs 302b and 302c. The absence of such flux entrapment results from the elimination of capillary action by separating bottom flange surface 302d from printed circuit board 301 by 0.020 inches. It has been found by experimentation that flange 302a and printed circuit board 301 must be separated by at least 0.017 inches in order to prevent the capillary action that would otherwise entrap flux between flange 302a and printed circuit board 301.

Use of only one rib, e.g., rib 302b, is sufficient to prevent such capillary action since such a 0.020 inch rib will also separate bottom flange surface 302d from printed circuit board 301 by 0.020 inches. However, use of only one such rib would result in an unstable connection of handle 302 to printed circuit board 301. Thus, the second rib, e.g., rib 302c, is required in order to facilitate a rigid connection of handle 302 to printed circuit board 301. Handle 302 is permanently affixed to printed circuit board 301 by means of rivets (not shown) which extend through handle 302 and printed circuit board 301 and pass between ribs 302b and 302c.

Since there is no flux entrapment between handle 302 and printed circuit board 301 there is no moisture absorption in that area and, therefore, there is no prolonged "bubbling out" of entrapped flux. Consequently, there is no need for baking to accelerate the moisture absorption process to completion and, similarly, there is no need for repetitive cleaning with a brush and local solvents. With the arrangement of the present invention it is only necessary to clean printed circuit board 301 once after the wave soldering process. And, that cleansing operation is limited to removal of whatever flux may remain in vertical opening 303 and the bottom side of the printed circuit board assembly after the wave soldering process.

Thus, the printed circuit board handle of the present invention provides a novel arrangement for eliminating flux entrapment between a printed circuit board and the associated handle.

It will be obvious to those skilled in the art that numerous modifications of the present invention can be made without departing from the spirit of the invention which shall be limited only by the scope of the claims appended hereto.

What is claimed is:

1. A printed circuit board handle for attachment to a printed circuit board, said printed circuit board handle comprising:
    a flange having first and second ribs protruding therefrom;
    said ribs having substantially the same length and being positioned substantially parallel and in close proximity to, but spaced apart from, each other, with the midpoint of each rib located in a plane perpendicular to the longitudinal axes of said ribs;
    said flange being attachable to said printed circuit board in such a manner that said ribs cause said flange to be spaced apart from said printed circuit board.

2. A printed circuit board handle as claimed in claim 1, wherein said ribs protrude at least 0.017 inches from said flange.

3. A printed circuit board handle as claimed in claim 1, wherein said ribs extend across the full length of said flange.

4. A printed circuit board handle as claimed in claim 1, wherein there is further included a cross member arranged perpendicular to said flange whereby the cross section of said printed circuit board handle is arranged in the shape of a capital letter "T".

5. A printed circuit board handle as claimed in claim 1, wherein said flange and said ribs are formed as a single aluminum extrusion.

* * * * *